United States Patent
Murphy et al.

(10) Patent No.: US 7,216,321 B2
(45) Date of Patent: May 8, 2007

(54) PATTERN RECOGNITION IN AN INTEGRATED CIRCUIT DESIGN

(75) Inventors: Bernard Murphy, San Jose, CA (US); Pratyush Kumar Prasoon, Noida (IN); Manish Bhatia, New Delhi (IN)

(73) Assignee: Atrenta, Inc., San Jose, CA (US)

( * ) Notice: Subject to any disclaimer, the term of this patent is extended or adjusted under 35 U.S.C. 154(b) by 409 days.

(21) Appl. No.: 10/783,091

(22) Filed: Feb. 23, 2004

(65) Prior Publication Data
US 2005/0108675 A1    May 19, 2005

Related U.S. Application Data

(60) Provisional application No. 60/452,970, filed on Mar. 10, 2003.

(51) Int. Cl.
*G06F 17/50* (2006.01)
*G06F 9/45* (2006.01)

(52) U.S. Cl. ................... 716/7; 716/4; 716/17

(58) Field of Classification Search .................... 716/1, 716/4–6, 7, 17, 18
See application file for complete search history.

(56) References Cited

U.S. PATENT DOCUMENTS

| | | | | |
|---|---|---|---|---|
| 4,794,528 A | * | 12/1988 | Hirose et al. | 707/6 |
| 5,537,330 A | * | 7/1996 | Damiano et al. | 716/18 |
| 5,940,529 A | * | 8/1999 | Buckley | 382/155 |
| 6,112,022 A | * | 8/2000 | Wei | 703/14 |
| 6,292,938 B1 | * | 9/2001 | Sarkar et al. | 717/138 |
| 6,470,486 B1 | * | 10/2002 | Knapp | 716/18 |
| 6,574,787 B1 | * | 6/2003 | Anderson | 716/18 |
| 6,591,402 B1 | * | 7/2003 | Chandra et al. | 716/5 |
| 7,054,315 B2 | * | 5/2006 | Liao | 370/392 |

* cited by examiner

*Primary Examiner*—Jack Chiang
*Assistant Examiner*—Nghia M. Doan
(74) *Attorney, Agent, or Firm*—Sughrue Mion, PLLC (57) ABSTRACT

A method for recognizing a pattern in a design of an integrated circuit (IC), comprising identifying a pattern correspondence element in a pattern instance. A pattern tree corresponding to the pattern instance is built. A list of candidate design correspondence elements in a design instance of the IC are built. Iteratively, for each design correspondence element in said list of candidate design correspondence elements each rank in a tree representation of said design instance built around said each design correspondence element is compared with corresponding rank in said pattern tree.

37 Claims, 7 Drawing Sheets

FIGURE 1 (Amended)

FIGURE 6 (Amended)

FIGURE 7

PATTERN RECOGNITION IN AN INTEGRATED CIRCUIT DESIGN

RELATED APPLICATIONS

This Application claims priority from co-pending U.S. Provisional Application Ser. No. 60/452,970 filed Mar. 10, 2003, the contents of which are incorporated herein by reference.

FIELD

The disclosed teachings are generally related to the analysis of integrated circuit (IC) designs, and more specifically to recognizing patterns in the IC design.

BACKGROUND

The design of most digital ICs is today a highly structured process based on a hardware description language (HDL) methodology. In an HDL method, the IC to be designed is first specified by a specification document. Then, the IC design is reduced to HDL code. This level of design abstraction is referred to as the register transfer level (RTL), and is typically implemented using an HDL language such as Verilog or VHDL. At the RTL abstraction, the IC design is specified by describing, in HDL code, the operations that are performed on data as it flows between circuit inputs, outputs, and clocked registers. The RTL description is referred to as the RTL code. The IC design, as expressed by the RTL code, is then synthesized to generate a gate-level description, or a netlist. The step of translating the architectural and functional descriptions of the design, represented by RTL code, to a lower level of representation of the design such as logic-level and gate-level descriptions is referred to as synthesis.

The IC design specification and the RTL code are technology independent. That is, the specification and the RTL code do not specify the exact gates or logic devices to be used to implement the design. However, the gate-level description of the IC design is generally technology dependent. This means that at this level the design is targeted to a specific manufacturing process. Generally, the design and manufacture of ICs is an expensive process. The expenses increase significantly towards the later stages of the design and manufacturing process. It is therefore necessary to provide tools that are capable of assisting the IC designer to detect design faults, also known as design "bugs", as early as possible in the design process. One such method is described in U.S. patent application Ser. No. 10/118,242, entitled "An Apparatus and Method for Handling of Multi-Level Circuit Design Data", assigned to the assignees of the present application, and hereby incorporated by reference in its entirety.

Figure 1:
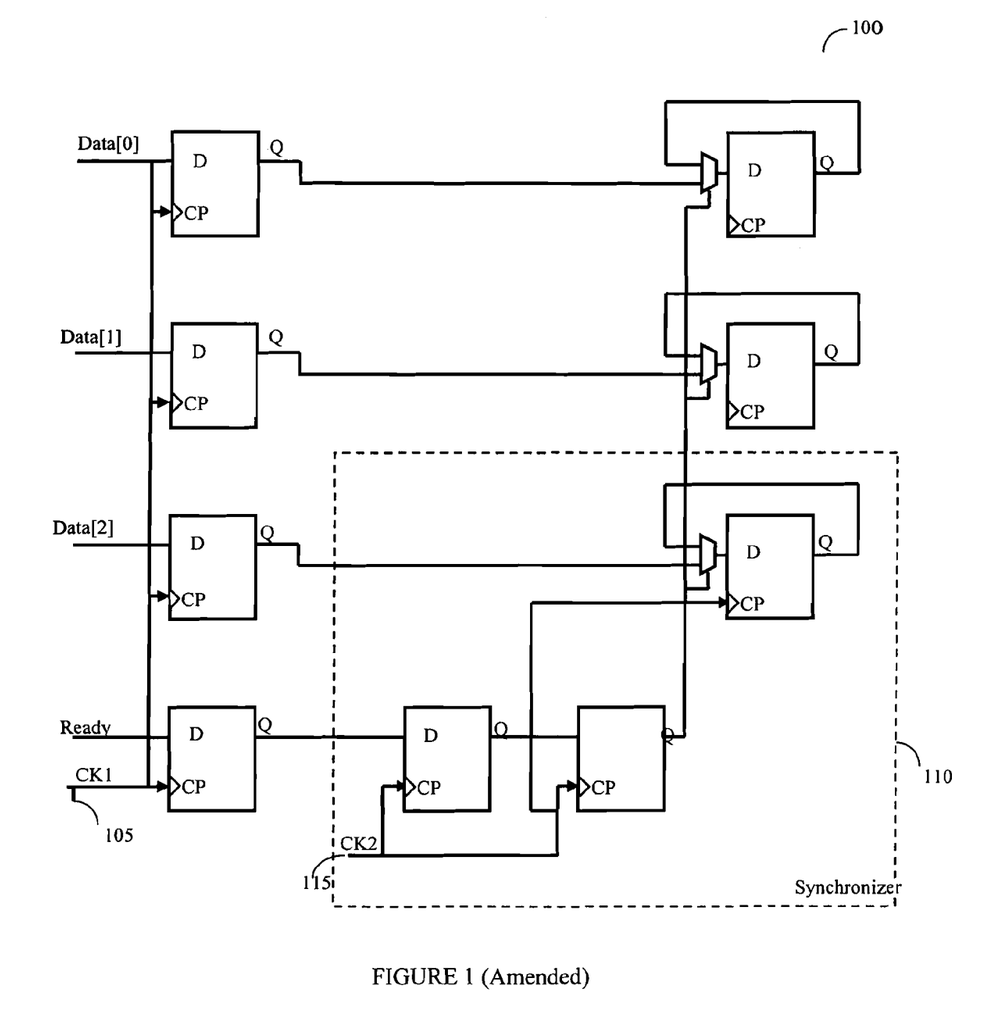
FIG. 1 is a schematic example of the use of a synchronized in a portion of an integrated circuit.

In many instances it is useful to be able to recognize a certain type of pattern in a logic design description. Recognizing these patterns then allows more detailed analysis around them. Referring to FIG. 1, a portion of a circuit 100 containing a data synchronizer 110 is shown. The synchronizer is a structure used to ensure that data is faithfully passed between two asynchronous clock domains. The two clock domains represent two portions of a circuit that are capable of functioning independently, including but not limited to operating within different frequencies of operation, but which still need to maintain the capability of transferring data from one circuit to the other.

Though many techniques for implementing such a structure are known, most designers practically use only a few techniques. Mostly the techniques that are used are the ones that the designer has determined to be acceptable for a specific objective. Therefore, it would then be desirable to be able to check, as part of the verification process, that every instance of synchronization in the design uses only an approved technique.

Such a verification task, if done manually using visual aids, would of course be impractical for today's sophisticated ICs containing millions of transistors. In performing such verification at the RTL level, recognizing patterns from an RTL description is extremely complex. This is because circuits may be represented in functionally equivalent but syntactically different ways. It is further possible that some portion of the circuit may straddle hierarchy boundaries, or have other characteristics that make identification very difficult from the syntax description. Referring again to FIG. 1, the RTL representation of the synchronizer might appear (in Verilog) as:

```
always @(posedge CLK2) begin
    if ( sel ) sel_in <= ready;
    else sel <= sel_in;
end
or,
always @(posedge CLK2) begin
    if ( sel ) out <= in;
    else out <= out;
end
```

It should be noted that the above two examples are only a couple of the numerous ways that the same functionality could be shown using the syntax available for RTL description.

SUMMARY

To overcome some of the disadvantages noted above, there is provided a method for recognizing a pattern in a design of an integrated circuit (IC), comprising identifying a pattern correspondence element in a pattern instance. A pattern tree corresponding to the pattern instance is built. A list of candidate design correspondence elements in a design instance of the IC are built. Iteratively, for each design correspondence element in said list of candidate design correspondence elements each rank in a tree representation of said design instance built around said each design correspondence element is compared with corresponding rank in said pattern tree.

Another aspect of the disclosed teachings is a computer program product including computer readable media with instructions to enable a computer to implement the disclosed techniques.

Yet another aspect of the disclosed teachings is a system for recognizing a pattern in a design of an integrated circuit (IC), comprising a compiler adapted to generate a pattern instance a design instance from the IC. A correspondence element identifier identifies correspondence element in the pattern instance and the design instance. A tree generator generates pattern tree and a tree representing the design instance around the correspondence element. A comparison unit iteratively compares rank in the tree representation of said design instance corresponding rank in said pattern tree.

BRIEF DESCRIPTION OF THE DRAWINGS

The disclosed teachings are discussed below in detail by way of various specific exemplary implementations, and illustrated in the enclosed drawing figures.

The drawing figures depict, in highly simplified schematic form, exemplary implementations embodying various aspects of the disclosed teachings. Many items and details that will be readily understood by one familiar with this field have been omitted for simplicity.

DETAILED DESCRIPTION

The disclosed techniques will now be taught using various exemplary implementations. Although the implementations are described in detail, it will be appreciated that the claimed invention is not limited to just these embodiments, but has a scope that is significantly broader. The appended claims represent the true scope of the claimed invention.

Following are the intended meaning of some of the terms used herein.

"Correspondence elements" shall refer to elements chosen as a starting point for a match, one in the current pattern and one in the design. These need not be unique in the pattern. If there is more than one potential element in the pattern, then the match attempt is repeated over all such correspondence elements.

"Fanin" refers to the list of input terminals from an instance. More particularly a fanin may refer to:
  a) the net attached to an input terminal; or,
  b) the list of ports and/or instance output terminals driving a net; or,
  c) the list of instance input terminals on the same instance output; or,
  d) the net driving an output port.

It should be noted that from a driving port, there are no fanins.

"Fanout" shall refer to the list of output terminals on a node. More particularly, fanout may refer to:
  a) the net attached to an output terminal; or
  b) the list of ports and/or instance input terminals driven by a net; or
  c) the list of node output terminals on an input node; or
  d) the net driven by an input port.

From an output port, there are no fanouts.

"Tree" shall refer to a tree structure corresponding to successive lists of fanin and fanout terminals, starting from the correspondence element. Each node in the tree is either a terminal or port.

"Node" shall refer to a node in a tree, typically corresponding to a terminal or port. The very first node, i.e., the root is a special case. This is a correspondence element rather than a terminal. The children of this node are the next set of fanin or fanout terminals following this terminal.

"Node rank" shall refer to the number of fanin or fanout steps from the correspondence element to the node, not including nets. For example, tree nodes for the input and output terminals on the correspondence element have a rank of '1'. The next level of nodes, i.e., those terminals connected through the fanin and fanout from the rank '1' terminals through nets to the next set of terminals, have a rank of '2', and so on.

"Port" shall refer to a node of a pattern that is a terminal, i.e., connecting the pattern to other terminals of other patterns, to the pattern functioning as an input or an output of the pattern.

Each pattern is described as a separate Verilog instance or VHDL entity/architecture. A collection of such patterns may be referred to as being part of a pattern library.

A technique that allows the matching of a pattern, or patterns, to a design of an IC or a portion thereof is described herein. An RTL description represents a convenient way for a user to represent a pattern to be identified with an IC or a portion thereof. If more than one pattern type needs to be recognized, then multiple such patterns can be described.

A pattern instance is an object that is representative of a pattern type. A pattern type defines a certain type of pattern in a logic design description, examples for pattern types are data synchronizers and double level registers. A pattern instance should be a pattern instance and the same is true for design instance/instance.

The correspondence element is an element in the pattern instance and in the design instance which uses as the starting point for the matching process In an exemplary implementation of the disclosed teachings, the patterns and the IC design are analyzed together. A synthesized and flattened view of the IC design as well as a separate synthesized and flattened view of each pattern are generated. Then, matches are found between each of the pattern views and the IC design view. The same synthesis engine is used to synthesize both the design and the patterns. In addition, they map to a common set of logic primitive gates. This ensures that a match can be attempted by topological comparison of the design and pattern graphs, without needing to perform complex logic equivalence checks. All external nodes in the pattern are expressed as ports in the appropriate description, e.g., Verilog or VHDL, of the pattern. Specifically, points defining boundaries of a pattern, beyond which any logic is allowed to match, are represented as ports.

According to an exemplary implementation of the disclosed teachings, it is possible to start pattern matching from each node in each pattern and comparing against each node in the design in turn. However, it is more efficient to start by comparing at likely correspondence points between the design and each pattern.

According to another exemplary implementation, correspondence points that are relatively rare in the design are chosen. In this implementation, candidate correspondence points can be established for each pattern by looking for characteristics in the pattern that are known to be relatively rare in a typical design. For example, if the pattern contains a 32-bit adder, such a 32-bit adder could be a suitable correspondence point, since 32-bit adders are relatively rare, in comparison to other entities like flip-flops commonly occuring in most designs.

Alternatively, in the synchronizer example introduced earlier, a suitable correspondence point could be a crossing of clock domains, i.e., a flip-flop (FF) clocked by one clock but receiving data from an asynchronous clock domain. Such FFs are relatively rare in a typical design. Regardless of the type of correspondence points chosen, the correspondence points will be referred to herein as "correspondence elements".

Figure 2:
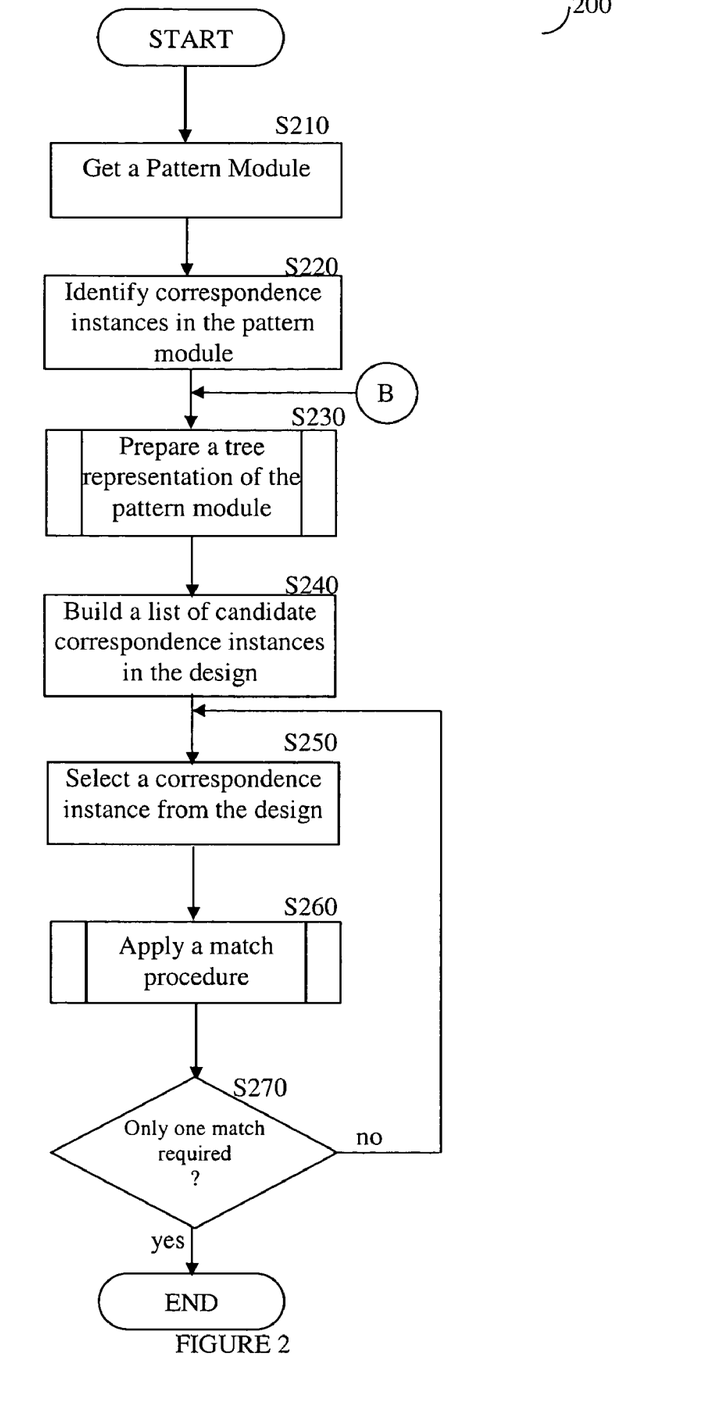
FIG. 2 is a flowchart of an exemplary technique for identifying a pattern in a design of an integrated circuit.

Reference is now made to FIG. 2 where an example technique 200 for the identification of a pattern in a design of an IC is shown. The technique disclosed attempts to match a given pattern instance to a given design instance. This is performed by generating a tree representation of the pattern instance around a correspondence element to form a pattern tree, followed by generating a tree representation of the design instance around the chosen correspondence element to form a design tree. Subsequently, each rank in the design tree is compared with the correspondence rank in the pattern tree. In step S210, a pattern instance to be matched is received. In step S220, a correspondence element, which is pattern node containing one element, is identified. In step S230 a tree representation of the pattern instance, is prepared.

Figure 3:
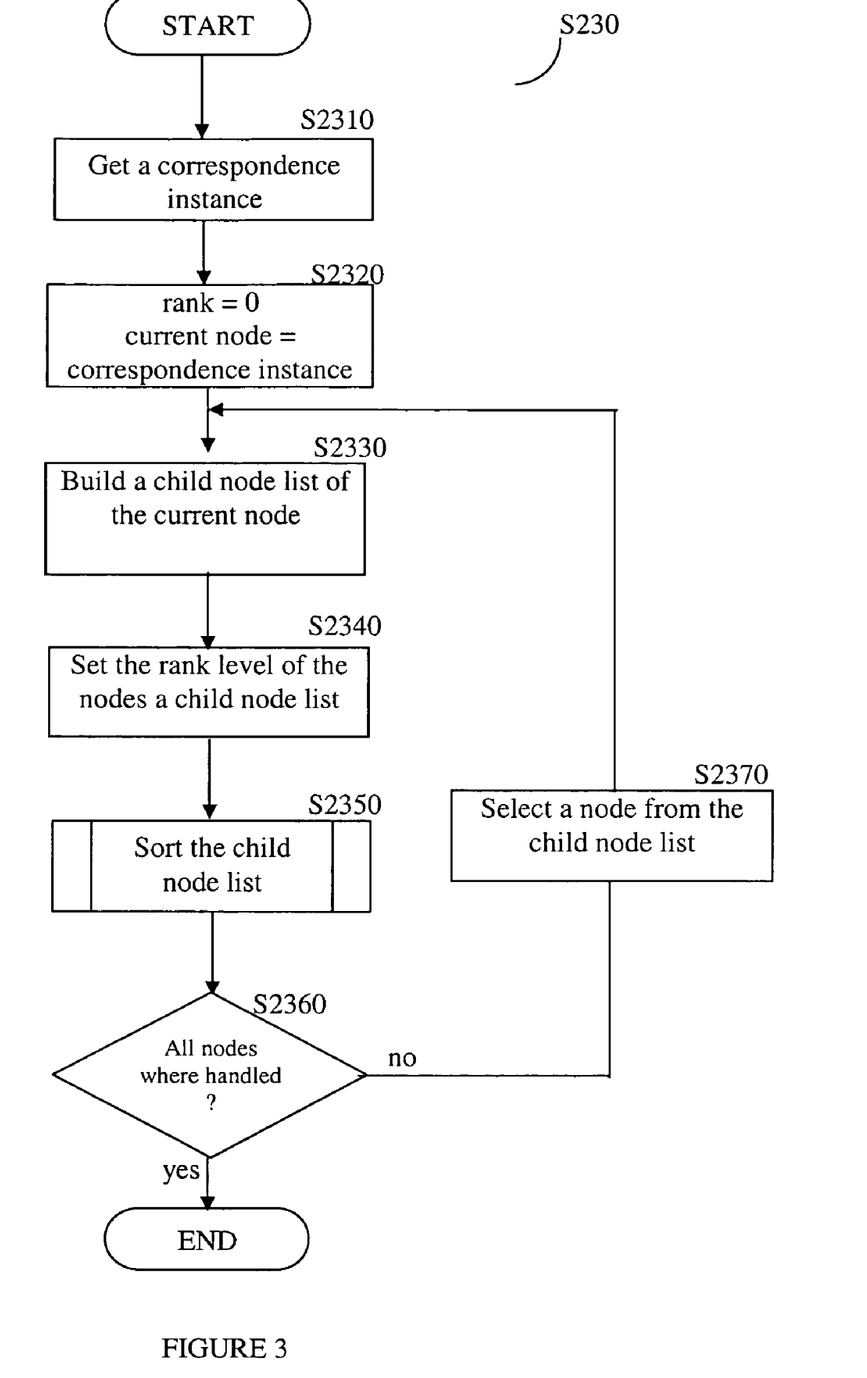
FIG. 3 is a detailed flowchart showing an exemplary implementation of preparing a tree representation.

A detailed flowchart describing S230 describing an exemplary implementation of preparing a pattern tree representation is shown in FIG. 3. A tree representation of the pattern instance is created around the correspondence element. In step S2310, the correspondence element of the pattern instance is received. In step S2320, a rank level variable is initialized to '0' and current node variable is set to be the correspondence element. The correspondence element is considered to be the root of the pattern tree. In step S2330, a list of fanin terminals and fanout terminals, i.e., a list of child nodes of the current node is prepared. Specifically, when beginning from a correspondence element, this is the list of fanin and fanout terminals of that correspondence element. When beginning from a fanout or fanin terminal of a correspondence element, this is the list of the next set of fanin and fanout terminals.

In preparing such a list, it is required to proceed through the net attached to the fanout or fanin terminal and prepare the list of fanout or fanin terminals of that net. When beginning from a fanin or fanout terminal of a correspondence element, this is the list of fanin and fanout terminals belonging to the same element. In step S2340, the node rank level of each node in the child node list is set to the value of its parent rank level incremented by '1', i.e., the rank level of the current node plus '1'. In step S2350 the list of terminals is sorted. The sort is performed according to the terminal name, represented as <master-name>/<terminal-name>.

To treat permutable terminals correctly, in the event that fanout or fanin goes through a permutable terminal, special handling takes place as will now be described with reference to an example implementation. Such permutable terminals are logically equivalent terminals on a gate. For example, the inputs to an AND gate are permutable because a connection with any input on such a gate can be swapped with a connection to any other input without changing the logic function. The same holds true for OR gates and XOR gates. This is not necessarily the case for other gates. For example, inputs on the terminals to a multiplexer (also known as a MUX) are not permutable. When terminals are permutable, in this example implementation they assigned equivalent node names.

For example, on an AND gate with three inputs, terminal-names could be AND/P, AND/P and AND/P, essentially making them equivalent. This ensures that in sorting, these connections can be re-sorted according to child connections.

Note that certain arithmetic functions, specifically commutative functions, have permutable input terminals, however it is slightly more complex. For example, A+B is equivalent to B+A, but if one bit is permuted, all bits must be permuted. When sorting nodes in a particular rank it may happen that there are two or more nodes having the same "master-name" and the same "terminal name". In this case, there is no certain way to determine the order of the nodes. In such a case, all the possible permutations are generated and added to the child nodes list.

In step S2360, a check is made to determine whether there are more nodes in the child node list that were not handled yet. If more nodes exist in the child node list, execution continues with step S2370; otherwise the execution is ended. In step S2370, a node from the current child node list, is chosen. A new node is chosen each time processing reaches this step, ensuring that eventually all the nodes in the child node list will be checked. The selected node is set to be the current node.

Referring back to FIG. 2, in step S240 a list of candidate correspondence elements of the design instance is prepared. In step S250, a single correspondence element from the list of candidate correspondence elements of the design is chosen. In step S260, a match procedure is applied. The match procedure receives two parameters: 1) a selected correspondence element in the design, and 2) the pattern tree that was generated in step S230. The procedure executed in step S260 tries to match one rank of the design instance to the corresponding rank in the pattern tree each time. The match procedure reports 'match' if the input pattern instance was found in the design. Step S260 is described in greater detailed below. In step 270, a check is performed to determine if only one match is required, and if so the execution is ended; otherwise the execution continues with step S250 where a new correspondence element from the candidate correspondence elements list of the design instance is selected.

It should be noted that pattern trees need only be built once. It should be further noted, that under the assumption that a candidate element matches only one pattern, a candidate element can be removed from the list of candidate instances to be matched, once it has matched one pattern. In another example implementation, all buffers can be removed during the fanin and fanout processing as they should not change the result of the logical comparison. A person skilled in the art could further add to the technique the capability to further detect inferred gates, for example, flip-flops that are created from a plurality of logical gates. This could be done as a pre-processing step such that comparison at all levels can be achieved by the disclosed technique.

Figure 4:
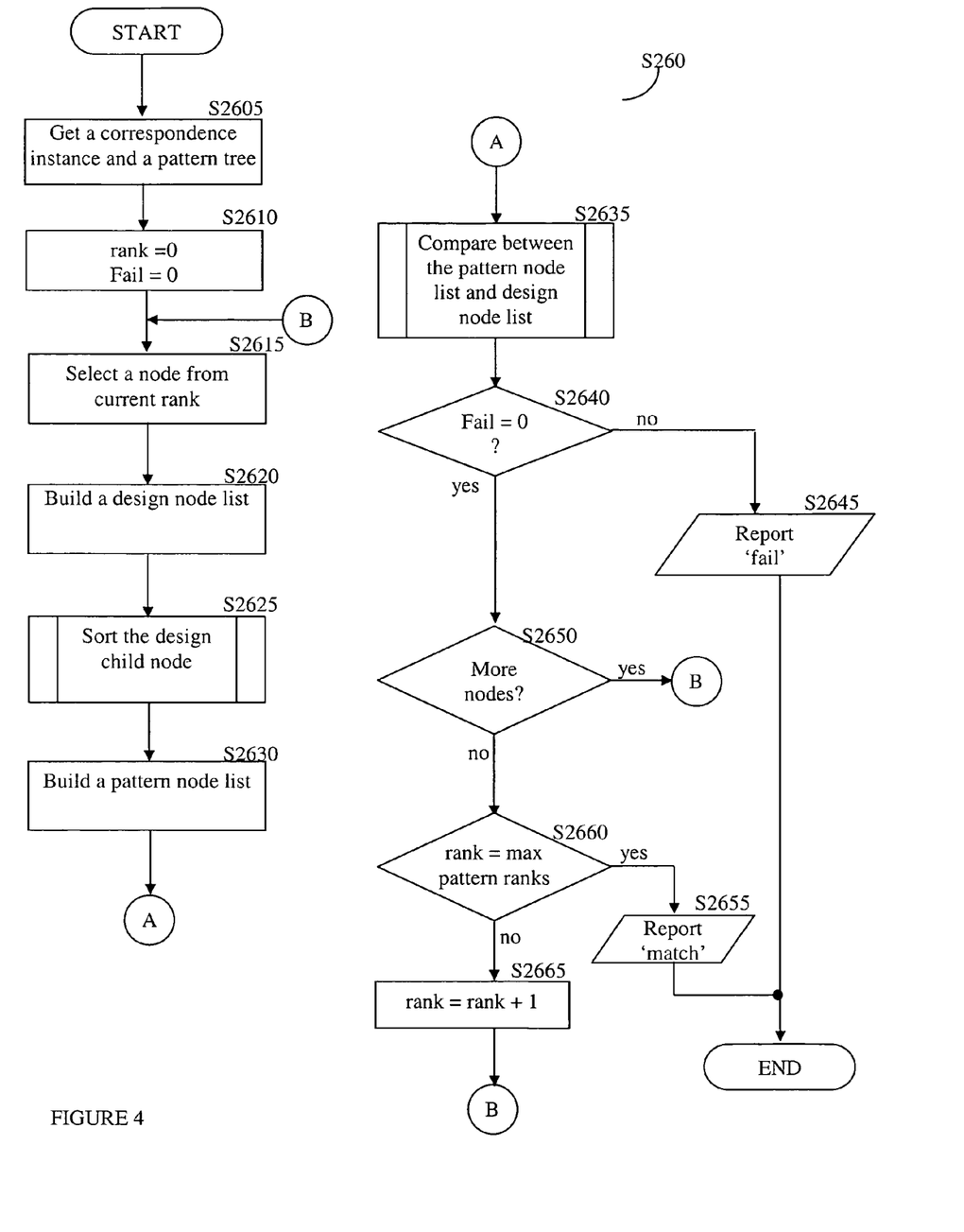
FIG. 4 is a detailed flowchart showing an exemplary implementation of a match procedure.

Reference is now made to FIG. 4 where a detailed flowchart S260 describing an example implementation of the match procedure is shown. In step S2605, the correspondence elements of the design instance and the pattern tree are received. In step S2610, a rank level and a fail variables are both initialized to '0'. In step S2615, a design node from the current rank, i.e., based on the value of the rank variable, is chosen. A new node is chosen each time processing reaches this step, ensuring that eventually all the nodes at this rank level will be checked. In step S2620 a list of child nodes of the selected design node (hereinafter the "design node list"), is prepared. This list includes the fanin terminals and fanout terminals, from the selected node. Subsequently, the parent node is added to the design node list. In step S2625, the design node list is sorted according to the terminal names, as described in greater detail above. In step S2630 a list of pattern nodes all from the same rank as the current rank (hereinafter the "pattern node list"), is prepared. In step S2635 a comparison of the pattern node list versus the design node list is performed.

Figure 5:
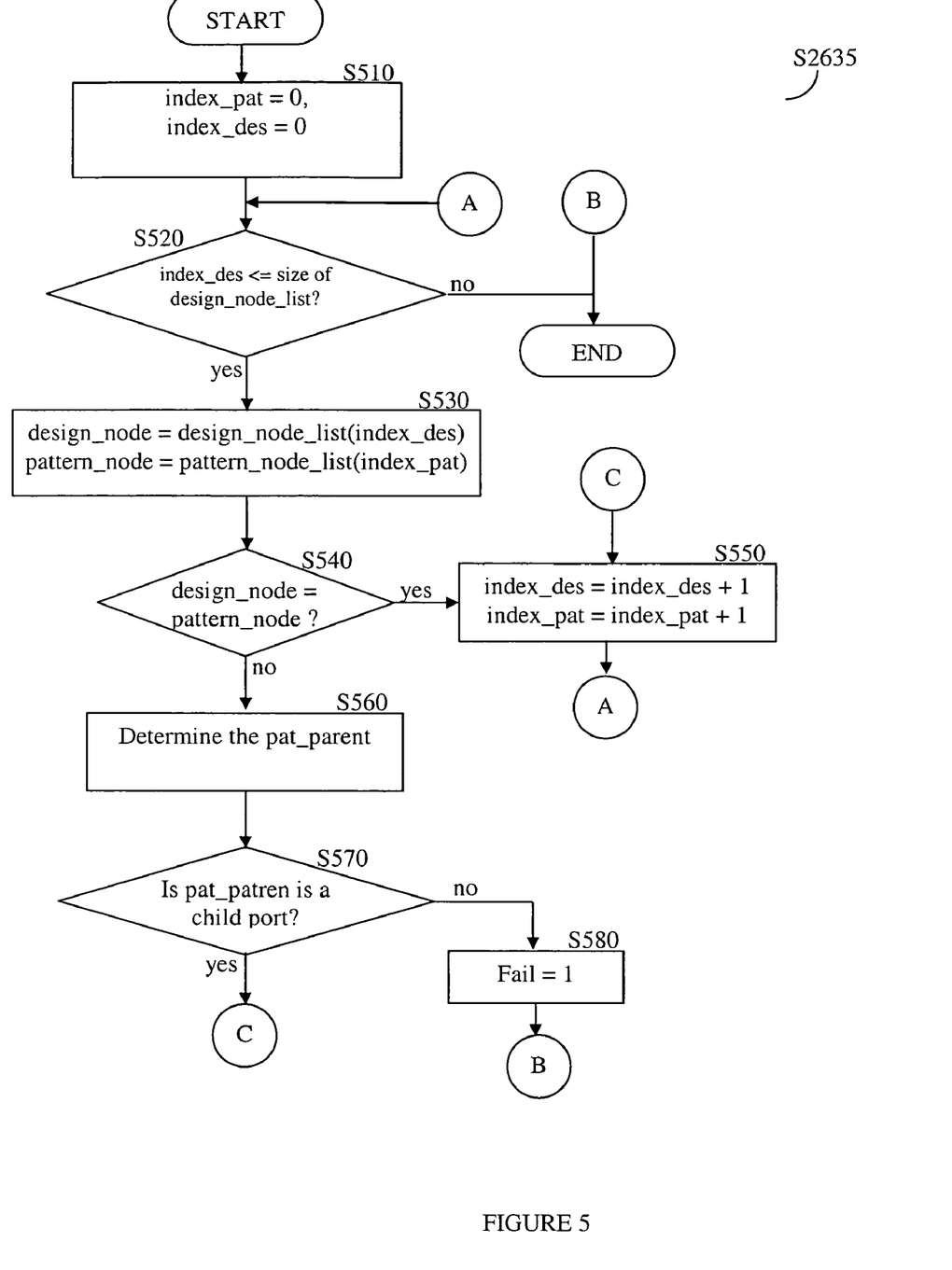
FIG. 5 is a detailed flowchart showing an exemplary implementation of a comparison of the pattern node and design node.

A more detailed flowchart of an exemplary implementation of the comparison process of step S2635 is shown in FIG. 5. In step S510, two variables receive an initial value. The variables index_pat and index_des are initialized to the value '0'. The index_pat is used to index the current node in the pattern node list, while the index_des is used to index the current node in the design node list. In step S520, the index_des variable is checked against the size of the design node list. If the comparison of the result shows that the design node list is greater than the index_des, then execution is ended; otherwise, the execution continues with step S530. In step S530 the variables design_node and pattern_node receive values from their respective lists. The variable design_node receives a value from the design node list pointed to by index_des, while the variable pattern_node receives a value from the pattern node list pointed to by index_pat. In step S540 it is checked whether the design node and the pattern node match, and if they do execution continues with step S550 where both index_des and index_pat are each incremented by '1', after which execution continues with step S520; otherwise, execution continues with step S560. It should be noted that two nodes are considered matched if: a) both nodes have the same terminal name, and b) the parents of both nodes are also matched. If the checked nodes are "dummy nodes", i.e., nodes that were replaced by the original nodes, then these nodes are considered matched only if their original nodes were matched. In step S560, a new variable pat_parent receives a value from a pattern node which matched with a parent node of the current examined design node, i.e., a design node pointed to by index_des. In step S570 a check is performed to determine if the child node of the pat_parent node is a port, and if it is execution continues with step S550; otherwise execution continues with step S580 where the fail variable is set to '1', indicating of a failure to match, and the execution terminates. It should be noted that a pattern input port can match a design output terminal or an input port, likewise, a pattern output port can match a design input terminal or an output port.

Referring back to FIG. 4, in step S2640 the status of the compare operation of step S2635 is determined. If the comparison has generated a 'fail' indication (i.e., fail=1) then execution continues with step S2645 where a report is generated indicating a failure to match; otherwise, execution continues with step S2650 where it is checked whether there are more nodes in the current rank to be checked, and if there are execution continues with step S2615. If all the nodes in the current rank were checked, then in step S2650 the rank variable is checked against the maximum number of ranks in the pattern tree. If the comparison of the result shows equality, then the execution continues with step S2655 where a report is generated indicating of a 'match', i.e., the pattern sought for was found. Otherwise execution continues with step S2665 where the rank variable is incremented by '1'.

Figure 6:
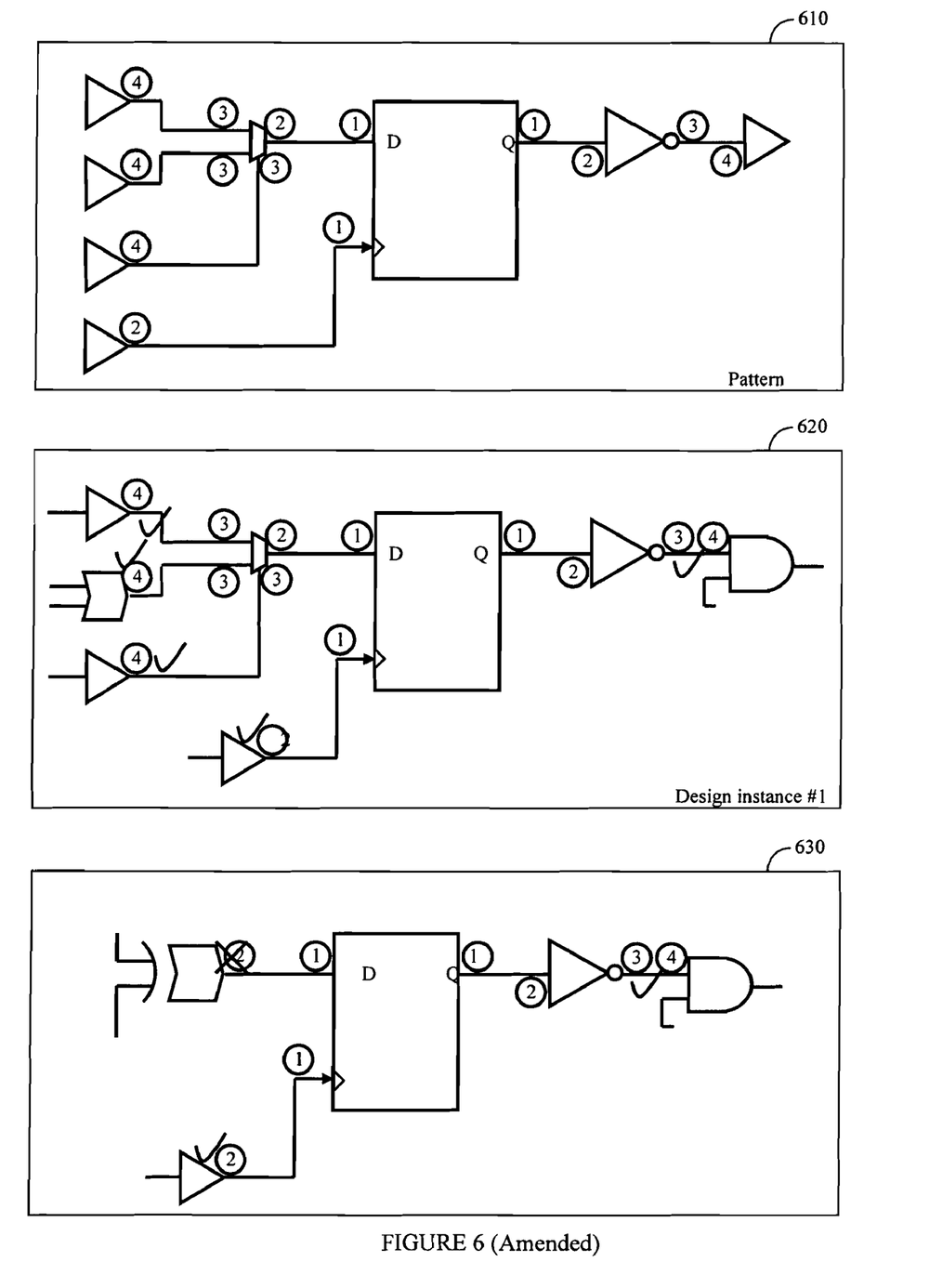
FIG. 6 shows an example of the results of the pattern matching according to the disclosed teachings.

Reference is now made to FIG. 6 where an example of the results of a pattern matching is shown. FIG. 6 shows a pattern 610 which is matched against two design instances, design instance 620 and design instance 630. The labels of each node (i.e., logic gate) represent the rank level of the node.

The pattern 610 corresponds to the following RTL description:

```
instance pat1(PA,PB,PC,PD,PO);
input PA,PB,PC,PD;
output PO;
reg PO;
reg r;
wire in = PC? PA: PB;
    always @(posedge PD)
        r <= in;
assign PO = !r;
endinstance
```

The design instance 620 corresponds to the following RTL description:

```
instance ...
...
wire a = A1;
wire y = !A4? a: A2|A3;
wire clk = A5;
    always @(posedge clk)
        x <= y;
assign A6 = !x | z;
...
endinstance
```

The design\instance 630 corresponds to the following RTL description:

```
instance ...
...
wire clk = B3;
    always @(posedge clk)
        x <= B1 ^ B2;
assign B4 = !x | z;
...
endinstance
```

For design instance 620 design nodes are matched with pattern nodes in accordance with the method disclosed in this invention. It can be clearly seen that all nodes match and hence there is a pattern match. In contrast, the same process takes place for design instance 630. However, in this case the match fails at level 2, where a XOR gate is found as an input to the Flip-Flop. At this point the comparison will fail, in accordance with the method disclosed in this invention. According to an embodiment of the invention, it is possible to start pattern matching from each node in each pattern and comparing against each node in the design in turn. However, according to another embodiment, efficiency is gained by starting by comparing at likely correspondence points between the design and each pattern. According to yet another embodiment of the invention, correspondence points that are relatively rare in the design are chosen with a highest priority. Candidate correspondence points can be established for each pattern by looking for characteristics in the pattern that are known to be relatively rare in a typical design. For example, if the pattern contains a 32-bit adder, that 32-bit adder would be a suitable correspondence point, since 32-bit adders are relatively rare, for example in comparison to flip-flops, in most designs. Alternatively, considering the synchronizer example introduced earlier, a suitable correspondence point could be a crossing of clock domains, i.e., a flip-flop (FF) clocked by one clock but receiving data from an asynchronous clock domain. Such FFs are relatively rare in a typical design. Regardless of which are chosen, they will be referred to herein as "correspondence elements".

Figure 7:
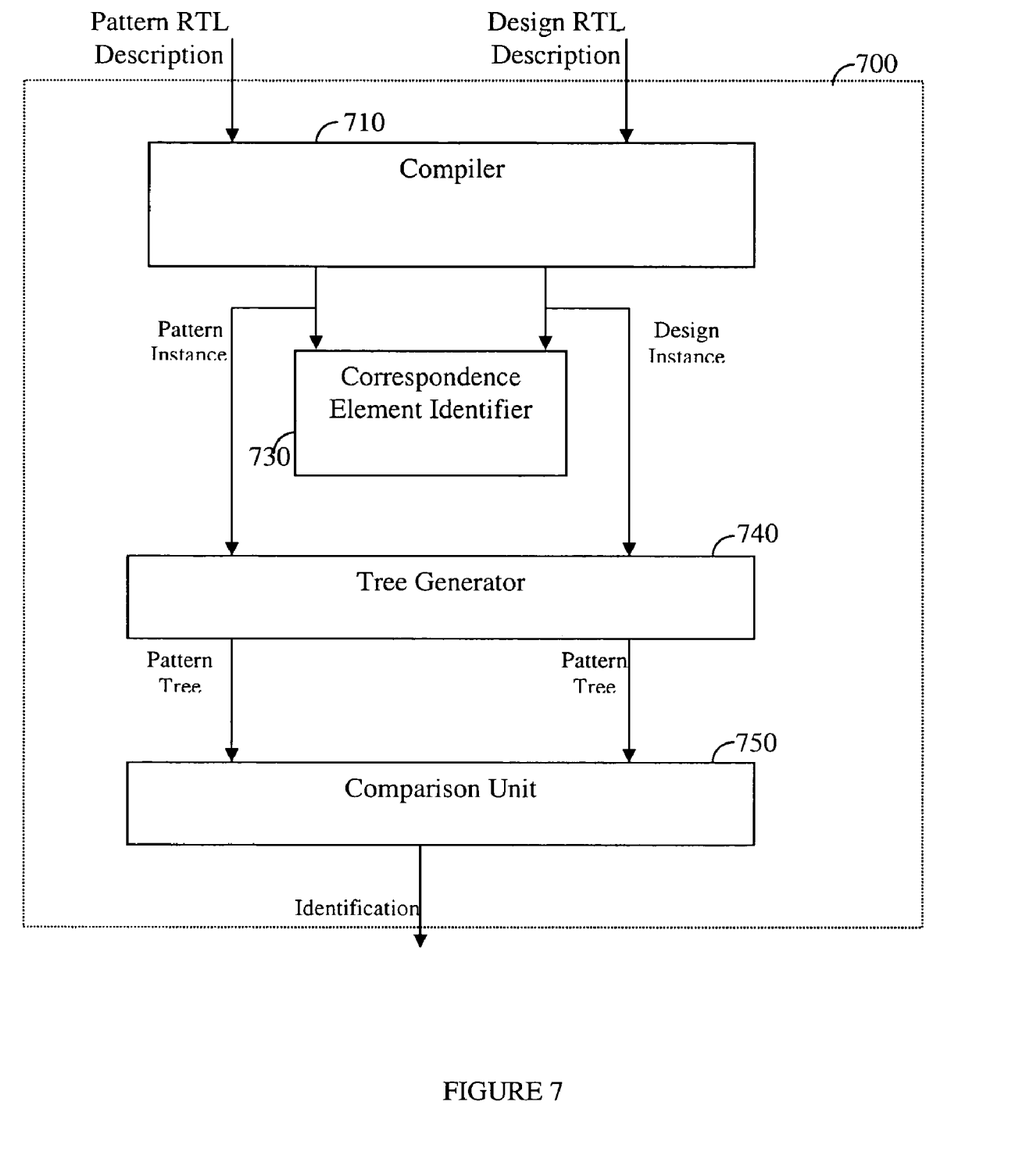
FIG. 7 is a system for recognizing a pattern in a design of an integrated circuit.

An exemplary implementation of a system 700 for recognizing a pattern in a design of an integrated circuit (IC) is shown in FIG. 7. A compiler 710 generates pattern instances design instances from the IC. Compiler 710 converts a textual RTL description into an in-memory synthesized and flattened representation. A correspondence element identifier 730 identifies correspondence element in the pattern instance and the design instance. A tree generator 740 generates pattern tree and a tree representing the design instance around the correspondence element. A comparison unit 750 iteratively compares rank in the tree representation of the design instance and a corresponding rank in the pattern tree.

The disclosed techniques can be implemented in software using a computing machine. The software could be in any type of computing language in any level. The techniques could also be implemented using a combination of hardware and software. Computer program products (including internet downloads) that include the software for implementing the disclosed techniques form part of the disclosed teachings.

Many variations to the above-identified embodiments are possible without departing from the scope and spirit of the invention, such as implementations as part of a computer software program, a computer aided design (CAD) system, a CAD program, and the like. Possible variations have been presented throughout the foregoing discussion. Moreover, it will be appreciated that combinations and subcombinations of the various embodiments described above will occur to those familiar with this field, without departing from the scope and spirit of the invention.

The invention claimed is:

1. A method, for recognizing a pattern in register transfer level (RTL) description of an integrated circuit (IC) design, comprising:
  a) identifying a pattern correspondence element in a pattern instance;
  b) building a pattern tree corresponding to the pattern instance;
  c) defining a list of candidate design correspondence elements in a design instance of the IC, wherein rare design correspondence elements are chosen from the list for comparison at a highest priority; and
  d) iteratively, for each element in said list of candidate design correspondence elements, comparing each rank in a tree representation of said design instance built around said each design correspondence element with corresponding rank in said pattern tree;
  wherein the comparing is performed using a sub-process comprising:
    d-1) selecting a rank for each node from the tree representation of said design instance to be matched;
    d-2) iteratively, for each node with the selected rank building a child node list;
    d-3) sorting said child node list;
    d-4) building a list of pattern nodes with the selected rank;
    d-5) matching between said list of pattern nodes and said child node list; and,
    d-6) repeating said steps d-1) through d-5) for all ranks in said design instance;
  wherein said child node list comprises terminals of said design instance;
  wherein, when comparing, nodes in said list of pattern nodes are matched against nodes in said child node list according to said nodes' order in said list of pattern nodes and said child node list;
  wherein said nodes are considered matched if said nodes have the same identification name;
  wherein said identification name comprises at least a terminal name; and
  wherein a report is generated indicating matched nodes.

2. The method of claim 1, wherein the pattern tree is built using a sub-process comprising:
  a) iteratively, for each node starting from said pattern correspondence element building a child node list;
  b) for each node in said child node list, setting a rank level of said each node; and c) sorting said child node list.

3. The method of claim 2, wherein a parent node is attached to said child node list of said parent node.

4. The method of claim 3, wherein said child node list comprises a list of fanin terminals.

5. The method of claim 3, wherein said child node list comprises a list of fanout terminals.

6. The method of claim 5, wherein said fanout terminals comprise a list of output terminals.

7. The method of claim 2, wherein said fanin terminals comprise a list of input terminals.

8. The method of claim 2, wherein said rank level is a number of terminal steps from said pattern correspondence element to a node having the rank.

9. The method of claim 8, wherein said terminals include at least one of fanin terminals and fanout terminals.

10. The method of claim 2, wherein said rank level is set to a rank level of a parent node of said child node list incremented by one.

11. The method of claim 10, wherein said rank level of the root of said pattern tree is set to zero.

12. The method of claim 10, wherein said sorting comprises a lexical sorting.

13. The method of claim 1, wherein a parent node is attached to said child node list of said parent node.

14. The method of claim 1, wherein permutable terminals are assigned equivalent node names.

15. The method of claim 14, wherein said child node list comprises a list of fanin terminals of said parent node.

16. The method of claim 1, wherein said child node list comprises a list of fanout terminals of said parent node.

17. The method of claim 1, wherein said sorting comprises a lexical sorting.

18. The method of claim 1, wherein, when a node is not matched, a report is generated indicating a failure to match.

19. A computer program product including computer-readable media with instructions to enable a computer to implement a process, for recognizing a pattern in a register transfer level (RTL) description of an integrated circuit (IC) design, the process comprising:
  a) identifying a pattern correspondence element in a pattern instance;
  b) building a pattern tree corresponding to the pattern instance;
  c) defining a list of candidate design correspondence elements in a design instance of the IC, wherein rare design correspondence elements are chosen from the list for comparison at a highers priority; and
  d) iteratively, for each element in said list of candidate design correspondence elements, comparing each rank in a tree representation of said design instance built around said each design correspondence element with corresponding rank in said pattern tree;

wherein the comparing is performed using a sub-process comprising:
  d-1) selecting a rank for each node from the tree representation of said design instance to be matched;
  d-2) iteratively, for each node with the selected rank building a child node list;
  d-3) sorting said child node list;
  d-4) building a list of pattern nodes with the selected rank;
  d-5) matching between said list of pattern nodes and said child node list; and,
  d-6) repeating said steps d-1) through d-5) for all ranks in said design instance;
wherein said child node list comprises terminals of said design instance;
wherein, when comparing, nodes in said list of pattern nodes are matched against nodes in said child node list according to said nodes' order in said list of pattern nodes and said child node list;
wherein said nodes are considered matched if said nodes have the same identification name;
wherein said identification name comprises at least a terminal name; and
wherein a report is generated indicating matched nodes.

20. The computer program product of claim 19, wherein the pattern tree is built using a sub-process comprising:
  a) iteratively, for each node starting from said pattern correspondence element building a child node list;
  b) for each node in said child node list, setting a rank level of said each node; and
  c) sorting said child node list.

21. The computer program product of claim 20, wherein a parent node is attached to said child node list of said parent node.

22. The computer program product of claim 21, wherein said child node list comprises a list of fanin terminals.

23. The computer program product of claim 21, wherein said child node list comprises a list of fanout terminals.

24. The computer program product of claim 23, wherein said fanout terminals comprise a list of output terminals.

25. The computer program product of claim 20, wherein said fanin terminals comprise a list of input terminals.

26. The computer program product of claim 20, wherein said rank level is a number of terminal steps from said pattern correspondence element to a node having the rank.

27. The computer program product of claim 26, wherein said terminals include at least one of fanin terminals and fanout terminals.

28. The computer program product of claim 20, wherein said rank level is set to a rank level of a parent node of said child node list incremented by one.

29. The computer program product of claim 28, wherein said sorting comprises a lexical sorting.

30. The computer program product of claim 20, wherein said rank level of the root of said pattern tree is set to zero.

31. The computer program product of claim 19, wherein a parent node is attached to said child node list of said parent node.

32. The computer program product of claim 19, wherein permutable terminals are assigned equivalent node names.

33. The computer program product of claim 32, wherein said child node list comprises a list of fanin terminals of said parent node.

34. The computer program product of claim 33, wherein said child node list comprises a list of fanout terminals of said parent node.

35. The computer program product of claim 19, wherein said sorting comprises a lexical sorting.

36. The computer program product of claim 19, wherein, when a node is not matched, a report is generated indicating a failure to match.

37. A system, for recognizing a pattern in a register transfer level (RTL) description of an integrated circuit (IC) design, comprising:
  a compiler adapted to generate a pattern instance and a design instance;
  a correspondence element identifier adapted to identify correspondence elements in the pattern instance and in the design instance, wherein rare design correspondence elements are chosen for a comparison at a highest priority;
  a tree generator to generate a pattern tree and a tree representation of the design instance around the correspondence element; and
  a comparison unit adapted to iteratively compare a rank in the tree representation of said design instance with a corresponding rank in said pattern tree;
  wherein the comparing is performed by the comparison unit according to a sub-process comprising:
    d-1) selecting a rank for each node in the tree representation the design instance;
    d-2) iteratively, for each node with the selected rank, building a child node list;
    d-3) sorting said child node list;
    d-4) building a list of pattern nodes with the selected rank;
    d-5) matching between said list of pattern nodes and said child node list; and,
    d-6) repeating said steps d-1) through d-5) for all ranks in said design instance;
  wherein said child node list comprises terminals of said design instance;
  wherein, when comparing, nodes in said list of pattern nodes are matched against nodes in said child node list according to said nodes' order in said list of pattern nodes and said child node list;
  wherein said nodes are considered matched if said nodes have the same identification name;
  wherein said identification name comprises at least a terminal name; and
  wherein a report is generated indicating matched nodes.

* * * * *